(12) United States Patent
Broberg et al.

(10) Patent No.: US 6,504,856 B1
(45) Date of Patent: Jan. 7, 2003

(54) METHOD AND APPARATUS FOR OPTIMIZING OPERATION POINTS OF A TUNABLE LASER

(75) Inventors: Björn Broberg, Djursholm (SE); Lars Andersson, Järfälla (SE)

(73) Assignee: Altitun AB, Jarfalla (SE)

( * ) Notice: Subject to any disclaimer, the term of this patent is extended or adjusted under 35 U.S.C. 154(b) by 0 days.

(21) Appl. No.: 09/600,575

(22) PCT Filed: Jan. 20, 1999

(86) PCT No.: PCT/SE99/00077

§ 371 (c)(1),
(2), (4) Date: Sep. 28, 2000

(87) PCT Pub. No.: WO99/40654

PCT Pub. Date: Aug. 12, 1999

(30) Foreign Application Priority Data

Jan. 21, 1998 (SE) .................................... 9800143

(51) Int. Cl.[7] .............................. H01S 3/00; H01S 3/10; H01S 3/13
(52) U.S. Cl. .................. 372/38.07; 372/20; 372/38.02; 372/29.015
(58) Field of Search ................................ 372/20, 38.02, 372/38.07, 38.09, 32, 29.015

(56) References Cited

U.S. PATENT DOCUMENTS 5,019,769 A  5/1991  Levinson ..................... 372/31
5,383,208 A  1/1995  Queniat et al. ............... 372/29
5,812,572 A * 9/1998  King et al. ................... 372/38
6,292,497 B1 * 9/2001  Nakano ................. 372/29.015

FOREIGN PATENT DOCUMENTS

| EP | 0 275 974 | 7/1988 |
|----|-----------|--------|
| EP | 0 300 790 | 1/1989 |
| EP | 0 512 541 | 11/1992 |
| EP | 0 529 732 | 3/1993 |
| WO | WO 98/00893 | 1/1998 |

* cited by examiner

Primary Examiner—Paul Ip
Assistant Examiner—Davienne Monbleau
(74) Attorney, Agent, or Firm—Altera Law Group, LLC (57) ABSTRACT

A method of optimizing the operation point of a laser, including characterizing the laser and controlling the different laser sections by varying the currents injected into the respective laser sections. The method includes sensing discontinuities that occur at mode jumps in a signal by utilizing a detection device that is firmly connected to the laser. Control of the different laser sections is effected by means of a control unit. Different control current combinations and the signal delivered by the detection device are provided to the control unit, which causes the control unit to detect the mode plane of the laser. At least a part of a mode plane, or several mode planes, are stored in a memory connected with the control unit, and the control unit controls the different laser sections so that the laser will operate at the desired operation point.

40 Claims, 4 Drawing Sheets

Prior Art

Prior Art

Prior Art

METHOD AND APPARATUS FOR OPTIMIZING OPERATION POINTS OF A TUNABLE LASER

BACKGROUND OF THE INVENTION

1. Field of the Invention

The present invention relates to a method of optimizing the operation points of lasers, and also to means for this end. More, specifically, the invention relates to a method of optimization that does not require the aid of external equipment as a reference.

2. Description of the Related Art

Tuneable semiconductor lasers include several different sections through which current is injected. The lasers typically have three or more sections. The wavelength, power and mode purity of the lasers can be controlled, by adjusting the current injected into the various sections. Mode purity implies that the laser shall be tuned to an operation point, i.e. tuned to a combination of the three or four injected drive currents, which is characterized in that the laser is distanced from a combination of the drive currents where so-called mode jumps take place and where lasering is stable and where sidemode suppression is high.

Special wavelength controls are required with different applications. For instance, in the case of sensor applications it must be possible to tune the laser continuously, so as to avoid mode jumps as far as possible In the case of telecommunications applications, it is necessary that the laser is able to retain its wavelength to a very high degree of accuracy and over very long periods of time, after having set the drive currents and the temperature. A typical accuracy in this respect is 0.1 nanometer while a typical time period is twenty years.

In order to be able to control the laser, it is necessary to map the behavoir of the laser as a function of the various drive currents. This is necessary prior to using the laser after its manufacture. However, it is also necessary to discern degradation of a laser in operation and to be able to compensate for this degradation by changing the drive currents. A change in the wavelength for a given operation point is an example of such degradation.

Mapping of the behavoir of a laser is normally effected by connecting the laser to different measuring instruments and then varying the drive currents systematically. Such instruments are normally power meters, optical spectrum analyzers for measuring wavelength and sidemode suppression, and line width measuring devices. This laser measuring process enables all of these parameters to be fully mapped as a function of all different drive currents.

However, the process has decisive drawbacks. The measuring processes are highly time-consuming and also generate large quantities of unnecessary data. It is not until the laser has been measured-up that suitable areas of operation can be discerned. Furthermore, an additional wavelength reference, for instance an optical spectrum analyzer or wavelength measuring device, is required in order to carry out the measurements. This makes it difficult to subsequently check or adjust the setting and/or the calibration of lasers that have already been installed in operation.

The present invention eliminates these drawbacks.

SUMMARY OF THE INVENTION

The present invention thus relates to a method of optimizing the operation point of a laser, by characterizing the laser and by controlling the various sections of the said laser. The different sections of the laser are controlled by varying the injected currents; and the laser is sensed with respect to discontinuities occurring in mode jumps in a signal delivered by a sensing device firmly connected to the laser. Control of the various laser sections is effected with the aid of a control unit and delete different control combinations and the signal delivered by, the sensing device are sent to the control unit, which detects the mode plane of the laser. At least a part of a mode plane or several mode planes is/are stored in a memory belonging to the control unit, which is caused to control different laser sections such that the laser will obtain the desired operation point.

The invention also relates to apparatus for carrying out the method.

BRIEF DESCRIPTION OF THE DRAWINGS

The invention will now be described in more detail with reference to exemplifying embodiments thereof and also with reference to the accompany drawings, in which.

DESCRIPTION AT THE PREFERRED EMBODIMENTS

Figure 1:
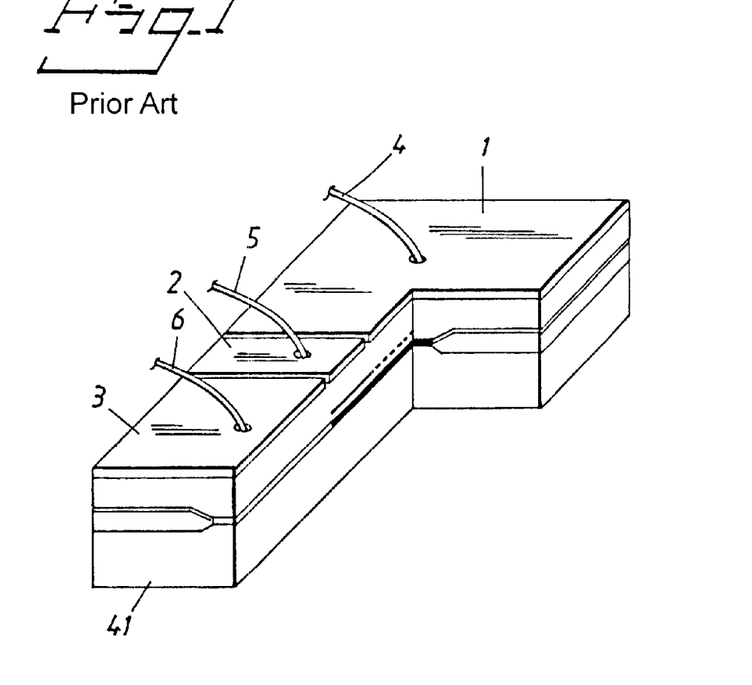
FIG. 1 is a partially cut-away, perspective view of a DBR laser.

As shown in FIG. 1 is a DBR laser which includes three sections, i.e. a Bragg reflector 1, a phase section 2 and an amplifying section 3. Each section is controlled by injecting current into respective sections through the medium of respective electrical conductors 4, 5, 6.

Although the invention is described below mainly with reference to a DBR laser according to FIG. 1, it will be understood that the invention is not restricted to any particular type of tuneable semiconductor laser. The invention can thus be applied with other tuneable lasers than those illustrated by way of example in the drawing Figures.

Figure 2:
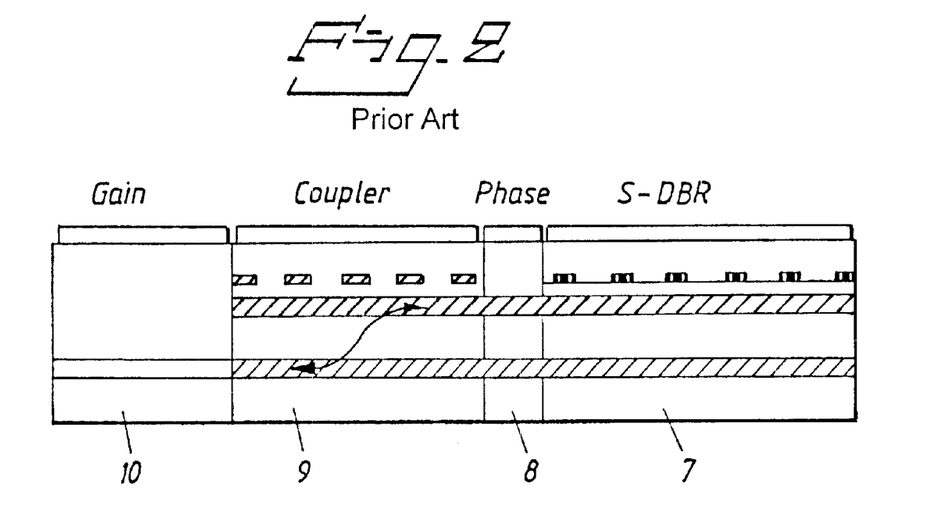
FIG. 2 is a cross-sectional view of a tuneable Grating Coupled Sampled Reflector (GCSR) laser.

FIG. 2 is a cross-sectional view of a tuneable Grating Coupled Sampled Reflector (GCSR) laser. Such a laser has four sections, namely a Bragg reflector 7, a phase section 8, a coupler 9, and an amplifying section 10. Each of the sections is controlled by injecting current thereinto.

Figure 3:
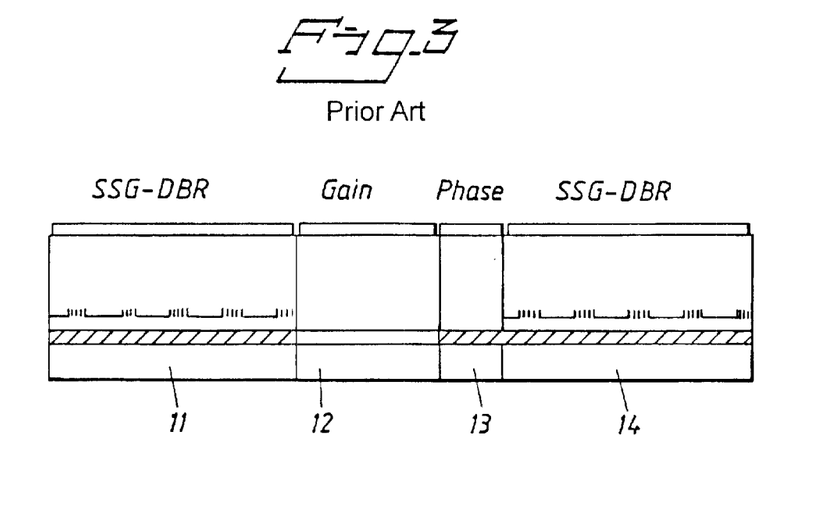
FIG. 3 is a cross-sectional view of a sampled grating DBR laser.

FIG. 3 is a sectional view of a sample grating DBR laser which also has four sections 11, 12, 13, 14, of which the sections 11 and 14 are Bragg reflectors and the sections 13 is a phase section, and section 12 is the amplifying section.

The aforesaid three types of laser are common. However, other types of lasers are also known to the art. As before mentioned, the present invention is not restricted to any particular type of laser.

When the tuning currents, i.e. the currents injected into the various sections, are changed, the wavelength of the laser, the suppression of sidemodes and the optical power of the laser will also be changed. In particular, the voltage across the active laser section will depend on whether the laser is located in a good operation point or close to a mode jump.

The laser will lase in a given mode for different combinations of tuning currents, and give rise to different generated powers and different wavelengths. For instance, if the Bragg current, i.e. the tuning current through the Bragg section, is swept, the laser will pass through a number of mode jumps. Each of these mode jumps causes an incremental change in the wavelength. Sidemode suppression is good between mode jumps, but poor at the instance of a mode jump. Consequently, the laser shall be caused to have an operation point that is well distanced from two mutually adjacent mode jumps.

The laser will also pass through a number of mode jumps when the phase current, i.e. the tuning current through the phase section, is swept.

Figure 4:
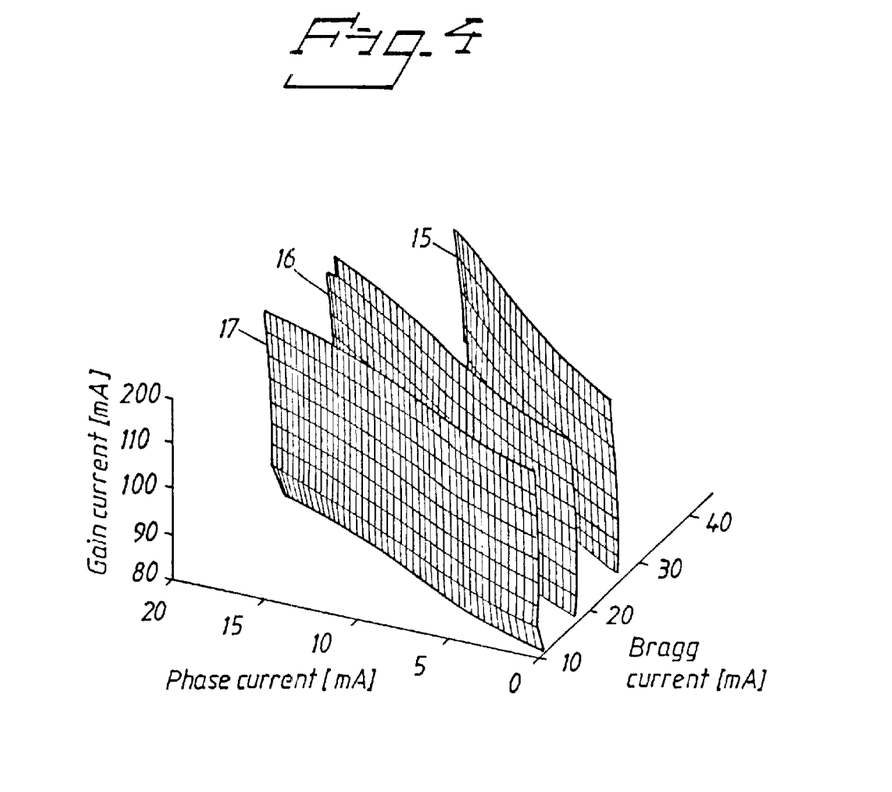
FIG. 4 is a diagrammatic illustration of mode planes in respect of phase current versus Bragg current.

FIG. 4 is a three-dimensional diagram showing mode planes 15, 16, 17 as a function of phase current, Bragg current and amplification current. The laser operates stably in combinations of the three tuning currents that lie on a mode plane. A mode jump occurs when moving from one mode plane to another. The laser can thus be operated so that combinations of the three tuning currents will lie on one mode plane. This results in a mode pure laser and in high sidemode suppression The wavelength also varies with said combinations and increases upwards and to the right along the mode planes shown in FIG. 4.

Figure 6:
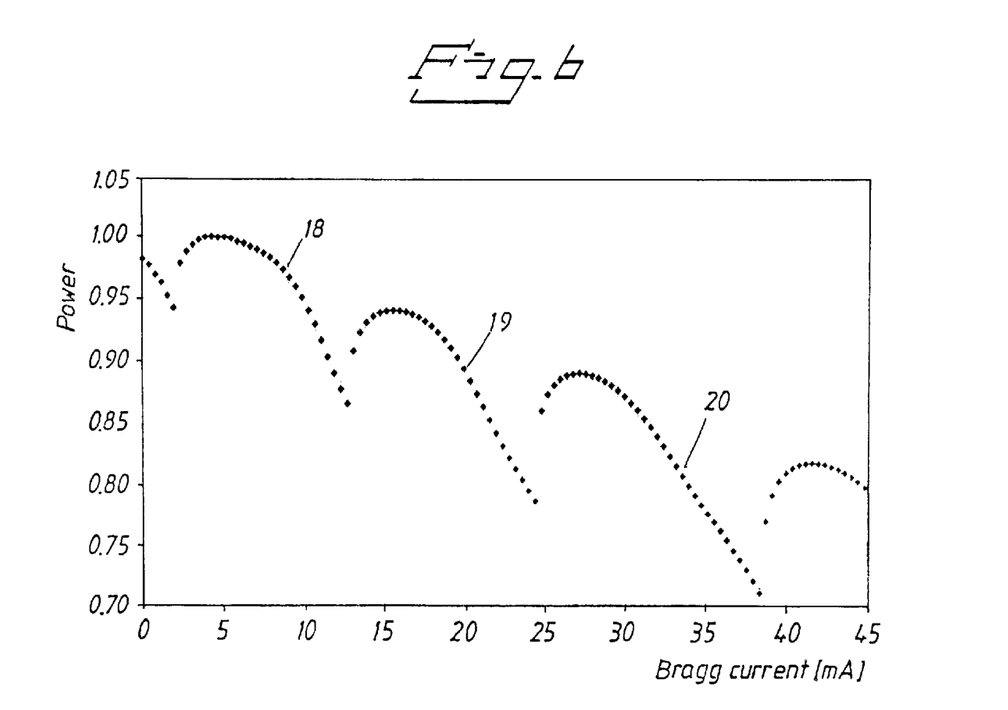
FIG. 6 is a diagrammatic illustration of delivered power versus tuneable current.

FIG. 6 is a diagram of the power delivered versus Bragg current, i.e. current through the Bragg section. When the Bragg current is swept and the mode jumps are passed through, there is obtained a discontinuous signal, or a signal whose derivative is discontinuous, both with respect to the power of the laser, as evident from FIG. 6, and also with respect to the voltage-across the active section.

These discontinuities coincide with discontinuous changes in transmitted wavelength and with the operation points when the laser is not mode-pure. The transmitted wavelength is dependent on the refractive index of the waveguide. The refractive index in question depends on the density of charge carriers in the waveguide, which, in turn, depends on injected current.

According to the invention, the control of the different laser sections 1, 2, 3 is effected by varying the currents injected thereinto. The laser 30 (see FIG. 8) is caused to detect the significance of discontinuities that occur in conjunction with mode jumps in a signal delivered from a sensing device which is firmly connected to the laser. Control of the various laser sections 1, 2, 3 is effected by a control unit 31. Different control combinations and the prevailing signal from the sensing device are sent to the control unit 31, wherewith the control unit is caused to detect the mode planes of the laser 30, and at least a part of one mode plane or several mode planes is caused to be stored in a memory 32 connected with the control unit 31. The control unit 31 is also caused to control the different sections 1, 2, 3 of the laser 30, such that the laser will obtain a desired operation point.

Figure 8:
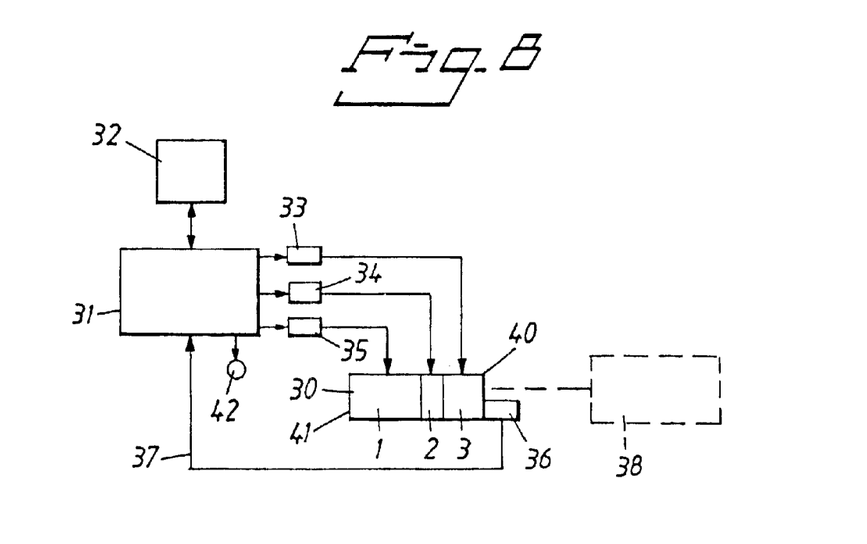
FIG. 8 is a block schematic of an arrangement apparatus according to the invention.

According to one highly advantageous embodiment of the invention, the sensing device includes a monitor detector 36, which is firmly connected to the laser 30 and which is caused to measure the optical power output of the laser for different control combinations of the various laser sections 1, 2, 3, where a signal delivered by the monitor detector 36 at different control combinations in response to the laser power output is sent to the control unit 31 over conductor 37.

Thus, by measuring the laser output power when, e.g., the Bragg current is swept, it is possible to identify good operation areas without needing to measure in a conventional manner the spectrum emitted by the laser, as mentioned above. Thus, the position of the mode jump is established by sweeping the tuning currents and reading the power emitted, despite not reading the laser spectrum in a conventional manner. The operation areas 18, 19, 20 between the discontinuities, i.e. the mode jumps, shown in FIG. 6 are suitable in this respect. The laser is suitably operated at an operation point where the power is maximum with respect to the Bragg current.

According to a preferred embodiment, one or more suitable operation points for the mode plane is/are stored in said memory.

In simple terms, the present invention functions to cause the laser to characterize itself through the medium of the monitor diode and systematic control of the different laser sections, and to store said characteristics in the control unit, thereby enabling the control unit to control the laser so that it will operate at desired operation points.

Although there have been described above a number of diagrams that include phase current, Bragg current, amplifying current and wavelength, it will be understood that relationships other than, e.g., phase current versus Bragg current can be is established and used to control a laser. This becomes more apparent when considering a laser other than a DBR laser, for instance a laser that includes four sections. Because the invention is not restricted to a DBR laser, the inventive method also comprises making those measurements that are necessary in respect of a given type of laser to calculate the relationships that shall be used to control the laser concerned.

FIG. 8 is a schematic illustration of an inventive arrangement in block diagram form. The numeral 30 identifies a DBR laser that has three sections 1, 2, 3. The reference numeral 31 identifies a control unit that includes a memory 32, which in this case is of the RAM type. The control unit is of a known suitable kind and may include a microprocessor or some other known control electronics. Thus, the control unit functions to control the sections individually with respect to injected current, through the medium of conventional current generators 33, 34, 35 connected to respective sections 3, 2, 1. The laser is provided with a conventional monitor diode 36 which is fixed relative to the laser and which constitutes said sensing device. The monitor diode is adapted to measure laser output power and to deliver to the control unit a signal corresponding to said power output, via conductor 37.

According to one preferred embodiment of the invention, light emitted from the laser is measured with the aid of a monitor detector that is connected to the front end-surface 40 of the laser and/or its rear end surface 41. However, it is also possible to measure said power with a monitor diode along a light conductor that extends from the front end-surface of the laser or from its rear end-surface. The monitor detector may alternatively be fully integrated with the laser.

When the monitor detector is placed on the front end-surface of the laser, curves corresponding to those shown in FIG. 6 are obtained. On the other hand, when the monitor detector is placed at the rear end-surface of the laser, a maximum in FIG. 6 will, of course, be corresponded by a minimum.

This will not make it difficult for one skilled in this art to create software for controlling the control unit in accordance with the inventive method, for instance in providing a microprocessor with appropriate software.

There has been described in the aforegoing a first embodiment where the sensing device includes a monitor detector.

According to a second embodiment of the invention, the sensing device includes, instead, a sensing circuit which is adapted to detect the voltage that prevails across the different laser sections when different amounts of current are injected into said sections 1, 2, 3. The detection circuit is firmly connected to the laser and is caused to measure the voltage across the various laser sections 1, 2, 3 for different combinations of laser section control. Signals delivered by the detection circuit at different control combinations are sent to the control unit 31.

When the laser is controlled with current and the laser goes through a mode jump, a discontinuity will occur in the voltage across one or more of the laser sections.

According to a third embodiment of the invention, said sensing device includes a sensing circuit which is adapted to detect the current that flows through the different laser sections when a voltage is applied to said sections 1, 2, 3. The detection circuit is firmly connected to the laser and is caused to measure the current that passes through the various laser sections 1, 2, 3 with different combinations of voltage control across said sections. Signals delivered by the detection circuit in response to different control combinations are sent to the control unit 31.

It appears that when the laser is controlled with voltage and the laser goes through a mode jump, a discontinuity will occur in the current that flows through one or more of the laser sections.

The circuit for detecting the voltage across the laser sections, or the current that passes therethrough, can be integrated in a known manner in the drive circuits 33–35 exemplified above as current generators. Alternatively, the detection circuits may be arranged separately. In the above case in which the different laser sections are controlled by applying a voltage, the reference numerals 33–35 in FIG. 8 designate conventional voltage generators.

An inventive arrangement can be considered as a laser module that includes a laser, a control unit, current or voltage generators, said detection device, etc., where the component parts are mounted on one and the same circuit board or like means.

According to one highly preferred embodiment of the invention, the control unit is caused to evaluate and store optimal laser operation areas in the form of single-dimensional curves corresponding to laser-section control combinations.

Figure 5:
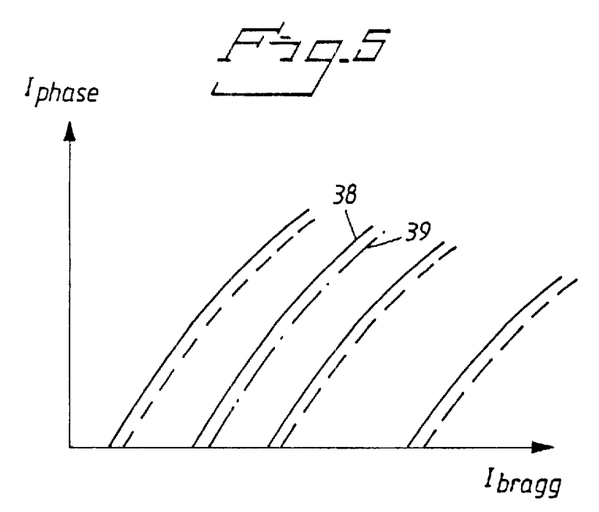
FIG. 5 is a diagrammatic illustration of phase current versus Bragg current.

As will be evident from FIG. 4, in the case of a DBR laser suitable operation areas are found on the mode planes, i.e. for certain combinations of phase current and Bragg current. For instance, the operation areas for a DBR laser can be described as single-dimensional curves in the plane comprised of phase current and Bragg current. Such two-dimensional curves, which form a part of the mode plane, are shown in FIG. 5.

It is not necessary to know the wavelength of the laser in all applications, the only requisite being that the laser operates stably and is mode-pure. This makes it unnecessary to establish the wavelength of the laser for the different operation points.

However, it is necessary in many applications to know precisely the wavelength transmitted. When the laser is controlled in accordance with said two-dimension curves, the wavelength transmitted by the laser is caused to be measured with an external instrument and the resultant measurement stored in the memory of the microprocessor, in accordance with a highly preferred embodiment of the invention. This greatly reduces the amount of information that need be stored in the memory of the microprocessor while enabling the laser to be controlled with great precision with respect to transmitted wavelength.

Figure 7:
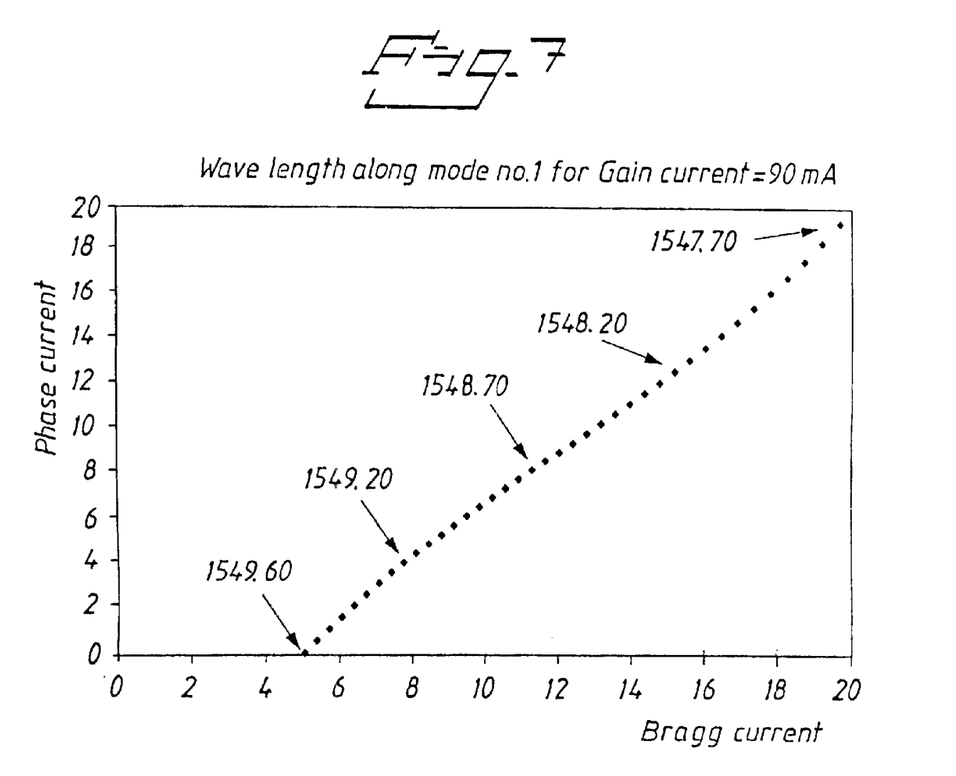
FIG. 7 illustrates wavelengths in a diagram of phase current versus Bragg current.

FIG. 7 is a diagrammatic illustration given by way of example of phase current versus Bragg current, in the form of a two-dimensional curve. The Figure also shows how the wavelength varies along the curve. The wavelength is given in nanometers.

According to one preferred embodiment of the invention, the control unit is caused to execute a new characterization of the laser at certain predetermined time intervals, and compare the values of the new characterization with corresponding values obtained from an earlier characterization. Thus, new operation areas will be detected in those cases when the working points of the laser have been shifted. Those curves that are measured in the first characterization are shown in full lines in FIG. 5, whereas the curves measured in a later characterization are shown in broken lines. Assume that the laser has operated along curve 38. As a result of the new characterization, the corresponding curve has shifted so as to comprise the chain-line curve 39.

This embodiment is extremely beneficial, since it renders it unnecessary to dismantle a laser in operation in order to ascertain conventionally whether or not the laser has drifted, and when necessary calculates new operation areas and adjusts the wavelengths.

According to another preferred embodiment, when the laser has given rise to changed values in comparison with an earlier characterization, the control unit is caused to change the control of the laser sections, so as to correct the wavelength transmitted by the laser substantially to conform to the wavelength that prevailed according to the earlier characterization.

In the example illustrated in FIG. 5, the control unit is adapted to control the laser along curve 39, so as to compensate for shifting of the operation point by the laser in the plane phase current-Bragg current, and therewith bring the wavelength to the correct value.

As before mentioned, the wavelength is determined by the amount of current injected into the section. A degradation can take place in time in the relationship between wavelength and current, this degradation being liable to destroy the wavelength accuracy of the laser. This degradation occurs primarily in the relationship between current and refractive index, whereas the relationship between refractive index and wavelength can be considered constant.

As will be understood from the aforesaid, the laser module is able to discern its mode jumps itself. For instance, when the laser degrades, the relationship between current and refractive index changes, whereas the relationship between the states of the mode jumps and refractive index can be considered as constant. Thus, changes in wavelength at a given current combination can be related to changes in positions of the mode jumps.

Thus, the laser module is able to itself discern when its wavelength drifts, without measuring the wavelength.

Furthermore, since the above relationships are known, the laser module is itself able to compensate for the fact that the current combination at which the laser will operate mode-pure at desired wavelengths must be changed relative to ageing of the laser. This results in a laser which remains stable over a very long period of time.

According to another preferred embodiment, the control unit is caused to activate an alarm indicator 42 when the laser has given rise to changed values in comparison with an earlier characterization, and when the change exceeds a predetermined level. This alarm indicator may be a light-emitting diode arranged in connection with the laser, or the control unit may send a signal to a monitoring computer or the like via a conductor. This embodiment enables an operator to be informed directly of which laser or lasers shall be taken out of operation and replaced with a new laser or lasers.

According to one advantageous embodiment of the invention, the operation point of the laser can be optimized automatically by applying a control signal on one or more tuning sections. An example of such application is found in sensor applications in which the wavelength of the laser shall be subjected to a slight wavelength control, in the Angstrom order of magnitude. This control can then be super-positioned to a greater and slower wavelength control.

It is assumed in this case that the laser has an optimal operation point when the wavelength coincides with optimal reflex from the Bragg section of the laser. By applying a control signal to, e.g., the phase section, the wavelength of the laser will be controlled. Assume that the control is so small that no mode jump will take place. The power measured via the monitor detector varies with the phase current and will have an extreme value, which is a maximum or minimum value depending on the end-surface from which measuring took place, when the phase current is optimal. When the phase-current control is multiplied by the measured power, there is obtained a signal which discloses the extent to which the bias point of the phase section shall be moved, and in which direction.

It will be obvious that the present invention solves the problems mentioned in the introduction and provides a highly beneficial method and arrangement.

Although the invention has been described with reference to exemplifying embodiments thereof, the person skilled in this art will have no difficulty in applying the invention to other types of lasers and therewith also in other types of laser applications.

The invention is therefore not restricted to the afore-described exemplifying embodiments, but can be modified within the scope of the accompanying claims.

What is claimed is:

1. A method of optimizing the operation point of a tunable laser including characterizing the laser and controlling different laser sections by use of a detection device for detecting the output of the laser when controlling the laser sections, said method comprising the steps of:

controlling the different laser sections by varying current injected into respective sections;

sensing discontinuities occurring at mode jumps in a signal from said detection device;

effecting control of the different laser sections by means of a control unit;

delivering different control combinations and a signal delivered from the detection device to the control unit;

detecting in the control unit a mode plane of the laser based on the sensed discontinuities;

storing at least a part of a mode plane in a memory connected with the control unit; and operating the control unit to control different laser sections so that the laser operates at a desired operation point.

2. A method according to claim 1, wherein the detection device includes a monitor detector which is firmly connected to the laser; measuring the optical power delivered by the laser at different control combinations of the different laser sections; and delivering to the control unit a signal from the monitor detector at different control combinations in relation to the power delivered by the laser.

3. A method according to claim 1, wherein said detection device includes a detection circuit to detect voltages across the different laser sections when different amounts of current are injected into said sections, said detection circuit being firmly connected to the laser measuring in the detection circuit the voltage across the different laser sections for different combinations of control current applied to the different laser sections; and sending to the control unit signals delivered from the detection circuit at different control combinations.

4. A method according to claim 1, wherein said detection device includes a detection circuit for detecting current that flows through the different laser sections when voltage is applied to said laser sections, said detection circuit being firmly connected to the laser; measuring in said circuit the current through the different laser sections for different voltage control combinations across the different laser sections; and sending to the control unit signals delivered from the detection circuit at different control combinations.

5. A method according to claim 1, including storing at least one operation point on the mode plane in said memory.

6. A method according to claim 1, including measuring light emitted from the laser by a monitor detector connected to a front end-surface of the laser.

7. A method according to claim 1, including evaluating and storing in the control unit optimal operation areas for the laser in the form of two-dimensional curves corresponding to control combinations of the laser sections.

8. A method according to claim 7, including measuring with an external instrument the wavelength transmitted by the laser and storing the measured wavelength value in the memory connected with said control unit.

9. A method according to claim 1, including executing a new characterization of the laser in the control unit at certain predetermined time intervals, wherein executing the new characterization includes sensing discontinuities occurring at mode jumps in a signal from said detection device, and comparing values of the new characterization with corresponding values from an earlier characterization.

10. A method according to claim 9, wherein when the laser has given rise to changed values in comparison with an earlier characterization, changing control of the laser sections to correct the wavelength transmitted by the laser to correspond essentially to the wavelength that prevailed in the earlier characterization.

11. A method according to claim 9, wherein when the laser has given rise to changed values in comparison with an earlier characterization and the change exceeds a predetermined level, activating an alarm indicator.

12. An arrangement for optimizing the operation point of a tunable laser having different laser section, said arrangement comprising:

a control unit to control the different laser section by varying currents injected into the laser sections, and a detection device to sense the laser with respect to discontinuities that occur in a signal from the laser at mode jumps;

wherein the control unit stores signals in a memory, the signals representing different combination of control and representing a signal delivered from the detection device, detects a mode plane of the laser based on the sensed discontinuities, at least a part of one mode plane being stored in the memory, and controls the different laser sections so that the laser operates at a desired operation point.

13. An arrangement according to claim 12, wherein said detection device includes a monitor detector which is firmly connected to the laser to measure the optical power output of the laser for different laser section control combinations; and wherein signals emitted from the monitor detector in response to the power output at different control combinations are sent to the control unit.

14. An arrangement according to claim 12, wherein said detection device includes a detection circuit to detect the voltage that prevails across the different laser sections when different amounts of current are injected into said laser sections, said detection circuit being firmly connected to the laser; wherein said detection circuit measures the voltage across the different laser sections for different laser section control combinations; and wherein signals delivered from the detection circuit at different control combinations are sent to the control unit.

15. An arrangement according to claim 12, wherein said detection device includes a detection circuit to detect the current that flows through the different laser sections when voltage is applied thereto, said detection circuit being firmly connected to the laser; wherein said detection circuit measures the current through the different laser sections for different combinations of voltage control across the different laser sections; and wherein signals delivered from the detection circuit at different control combinations are sent to the control unit.

16. An arrangement according to claim 13, wherein light emitted from the laser is measured with a monitor detector connected to a front end-surface of the laser.

17. An arrangement according to claim 12, wherein the control unit executes a new characterization of the laser at certain predetermined time intervals, wherein executing the new characterization includes sensing discontinuities occurring at mode jumps in a signal from said detection device, and compares the values of the new characterization with corresponding values from an earlier characterization.

18. An arrangement according to claim 17, wherein when the laser has given rise to changed values in comparison with an earlier characterization, the control unit changes the control of the laser sections to correct the wavelength transmitted by the laser to essentially the wavelength that prevailed in the earlier characterization.

19. An arrangement according to claim 17, wherein when the laser has given rise to changed values in comparison with an earlier characterization and the change exceeds a predetermined value, the control unit activates an alarm indicator.

20. A method according to claim 1, including measuring light emitted from the laser by a monitor detector connected to a rear end-surface of the laser.

21. An arrangement according to claim 13, wherein light emitted from the laser is measured with a monitor detector connected to a rear end-surface of the laser.

22. A method of optimizing the operation points of a tunable laser having multiple tuning sections and a monitor device, the method comprising:
adjusting values of control current passing through the tuning sections;
sensing discontinuities occurring at mode jumps using the monitor device; and
determining at least one desired operating point based on the values of current passing through the tuning sections when the discontinuities are sensed.

23. A method as recited in claim 22, wherein determining the at least one operating point includes determining a mode plane of the laser based on the values of current passing through the tuning sections and the discontinuities sensed by the monitor device, and determining the at least one desired operating point from the mode plane.

24. A method as recited in claim 22, further comprising delivering a signal from the monitor device to a control unit, wherein the control unit senses the discontinuity based on the signal received from the monitor unit.

25. A method as recited in claim 22, further comprising passing values of current through the tuning sections of the laser so that the laser operates at the at least one desired operating point.

26. A method as recited in claim 22, wherein the monitor device is a photodetector integrated with the laser and sensing the discontinuities includes detecting light output from the laser with the photodetector and directing a detector signal from the photodetector to a control unit.

27. A method as recited in claim 22, wherein the monitor device is a voltage detection circuit to detect a voltage across at least one section of the laser, and sensing the discontinuities includes sensing the voltage across at least one section of the laser and directing a voltage signal to a control unit.

28. A method as recited in claim 22, wherein the monitor device is a current detection circuit to detect a current passing through at least one section of the laser, and sensing the discontinuities includes sensing the current passing through the at least one section of the laser and directing a current signal to a control unit.

29. A method as recited in claim 22, further comprising storing at least one operation point on the mode plane in memory.

30. A method as recited in claim 22, further comprising evaluating and storing in a control unit optimal operation areas for the laser in the form of two-dimensional curves corresponding to control current combinations of the laser sections.

31. A method as recited in claim 22, including repeating the steps of adjusting the values of control current and sensing discontinuities occurring at mode jumps using the monitor device at predetermined time intervals, comparing resulting information on discontinuities with previously obtained information on discontinuities and redetermining the at least one operating point if the resulting information on discontinuities differs from the previously obtained information on discontinuities by a predetermined amount.

32. A method as recited in claim 31, further comprising, after redetermining the at least one operating point, changing control of the laser sections to correct a wavelength transmitted by the laser to correspond to a predetermined value of wavelength.

33. A tunable laser system, comprising
a laser having at least two tuning sections;
a monitor device to monitor discontinuities in operation of the laser; and
a control unit coupled to direct control currents to the at least two tuning sections and coupled to receive a detection signal from the monitor device indicative of the discontinuities, the control unit determining at least one desired operating point based on the values of control current passing through the tuning sections when the discontinuities are sensed by the monitor device.

34. A system as recited in claim 33, wherein determining the at least one operating point includes determining a mode plane of the laser based on the values of control current passing through the tuning sections and the discontinuities sensed by the monitor device, and determining the at least one desired operating point from the mode plane.

35. A system as recited in claim 33, wherein the monitor device includes a photodetector coupled to direct light detection signals to the control unit.

36. A system as recited in claim 35, wherein the photodetector is integrated with the laser.

37. A system as recited in claim 33, wherein the monitor device is a voltage detection circuit disposed to detect a voltage across at least one section of the laser, the voltage detection circuit being coupled to direct voltage information to the control unit.

38. A system as recited in claim 33, wherein the monitor device is a current detection circuit to detect a current passing through at least one section of the laser, the current detection unit being coupled to direct current information to the control unit.

39. A system as recited in claim 33, wherein the control unit further includes a memory unit coupled to store information related to the at least one desired operating point.

40. A system as recited in claim 33, wherein the control unit adjusts the values of control current and senses discontinuities occurring at mode jumps using the monitor device at predetermined time intervals, and compares resulting information on discontinuities with previously obtained information on discontinuities and redetermines the at least one operating point if the resulting information on discontinuities differs from the previously obtained information on discontinuities by a predetermined amount.

* * * * *